(12) United States Patent
Koo et al.

(10) Patent No.: US 11,374,306 B2
(45) Date of Patent: Jun. 28, 2022

(54) ELECTRONIC DEVICE COMPRISING METAL CASE HAVING METAL PAD ATTACHED THERETO

(71) Applicant: Samsung Electronics Co., Ltd., Suwon-si (KR)

(72) Inventors: Ja-myeong Koo, Suwon-si (KR); Jeong-gen Yoon, Suwon-si (KR); Young-chul Lee, Suwon-si (KR); Myeong-hwa Kim, Suwon-si (KR); Tae-hyeong Kim, Suwon-si (KR); Yeon-kwan Moon, Daegu (KR); Min-goo Seo, Suwon-si (KR); Seung-yup Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 440 days.

(21) Appl. No.: 16/324,322

(22) PCT Filed: Aug. 23, 2017

(86) PCT No.: PCT/KR2017/009225
§ 371 (c)(1),
(2) Date: Feb. 8, 2019

(87) PCT Pub. No.: WO2018/043986
PCT Pub. Date: Mar. 8, 2018

(65) Prior Publication Data
US 2019/0221919 A1    Jul. 18, 2019

(30) Foreign Application Priority Data
Aug. 30, 2016 (KR) .................. 10-2016-0111045

(51) Int. Cl.
*H01Q 1/24* (2006.01)
*H05K 5/04* (2006.01)
(Continued)

(52) U.S. Cl.
CPC ............. *H01Q 1/243* (2013.01); *H01Q 1/24* (2013.01); *H01R 12/707* (2013.01);
(Continued)

(58) Field of Classification Search
CPC ............. H01Q 1/243; H01R 43/0221; H01R 43/0256; H01R 12/707; H05K 5/04
See application file for complete search history.

(56) References Cited

U.S. PATENT DOCUMENTS 6,544,047 B2    4/2003    Moore
7,541,986 B2    6/2009    Park
(Continued)

FOREIGN PATENT DOCUMENTS

JP      2001191968 A  *  7/2001
JP      2005-045810 A    2/2005
(Continued)

OTHER PUBLICATIONS

Machine Translation of JP 2012044008 A 2012.*

*Primary Examiner* — Seokjin Kim
*Assistant Examiner* — Jianzi Chen
(74) *Attorney, Agent, or Firm* — Jefferson IP Law, LLP

(57) ABSTRACT

An electronic device comprising a metal case having a metal pad attached thereto is disclosed. According to the present invention, the electronic device comprises: a metal case having a metal terminal part formed therein; a metal pad joined to the metal terminal part by laser welding; and a conductive first coating layer coated on one surface of the metal pad, wherein the light reflectivity of the first coating layer is lower than the light reflectivity of the metal pad.

14 Claims, 18 Drawing Sheets

(51) Int. Cl.
  *H01R 13/24* (2006.01)
  *H01R 43/02* (2006.01)
  *H01R 12/70* (2011.01)

(52) U.S. Cl.
  CPC ..... *H01R 13/2421* (2013.01); *H01R 13/2442* (2013.01); *H01R 13/2471* (2013.01); *H01R 43/0221* (2013.01); *H01R 43/0256* (2013.01); *H05K 5/04* (2013.01)

(56) References Cited

U.S. PATENT DOCUMENTS

| | | | |
|---|---|---|---|
| 8,587,485 | B2 | 11/2013 | Tahk et al. |
| 9,583,825 | B2 | 2/2017 | Jung |
| 2005/0017910 | A1 | 1/2005 | Park |
| 2010/0331050 | A1 | 12/2010 | Tank et al. |
| 2015/0042528 | A1 | 2/2015 | Jung |
| 2015/0194586 | A1* | 7/2015 | Chen ................ H01L 33/08 257/91 |
| 2018/0310423 | A1* | 10/2018 | Koo ................ H01R 13/03 |

FOREIGN PATENT DOCUMENTS

| | | |
|---|---|---|
| JP | 2012-044008 A | 3/2012 |
| JP | 2012044008 A * | 3/2012 |
| KR | 10-1099502 B1 | 12/2011 |
| KR | 10-1381135 B1 | 4/2014 |
| KR | 10-394459 B1 | 5/2014 |
| KR | 10-1400846 B1 | 5/2014 |
| KR | 10-2015-0017179 A | 2/2015 |
| KR | 10-2015-0045180 A | 4/2015 |
| KR | 10-1552155 B1 | 9/2015 |
| KR | 10-1632205 B1 | 6/2016 |
| KR | 10-2017-0048043 A | 5/2017 |

* cited by examiner (a)

(b)

ELECTRONIC DEVICE COMPRISING METAL CASE HAVING METAL PAD ATTACHED THERETO

FIELD OF THE INVENTION

Devices and methods consistent with what is disclosed herein relate to an electronic device comprising a metal case having a metal pad attached thereto, and more particularly, to an electronic device for preventing a terminal provided on a circuit board from being corroded or damaged due to friction with a metal pad by laser welding a metal pad to a metal terminal part provided in a metal case.

Mobile electronic devices comprising a case formed of a pure metal or an alloy material having a relatively low surface hardness such as aluminum, titanium, zinc, magnesium, etc. increase. Such mobile electronic devices achieve high structural rigidity, less weight, and small thickness compared to the conventional electronic devices comprising a case formed of a plastic material. The mobile electronic devices comprising a metallic case have sophisticated texture of metal which is attractive to a user to purchase.

Such mobile electronic devices use a metal case as an antenna or part of an electronic circuit. In this case, the antenna or the electronic circuit may be electrically connected to a circuit board arranged in the electronic device. A contact terminal such as C-clip electrically connected to the antenna or the electronic circuit may be provided on the circuit board. Such the C-clip may be electrically connected to a metal terminal part formed in the part of the metal case.

However, metals such as aluminum, magnesium, titanium, zinc, iron, and stainless steel used as a material of the metal case have a lower hardness and a less corrosion resistance than metals such as gold, silver, platinum, and palladium, which are key materials of the C-clip. Therefore, a metal terminal part has a fine scratch in the part contacting the C-clip, and this part is easily corroded. Due to such corrosion, a conventional electronic device has malfunctions due to the contact failure.

In order to solve the above problem, a metal pad is bonded to a metal terminal part of a metal case to use. The metal pad may have a conductivity and a corrosion resistance, and be formed of a metal material having a high hardness.

Conventionally, various attachment methods have been suggested to attach the metal pad to the metal case, for example, an ultrasonic welding method.

The ultrasonic welding method uses a very thin metal pad, i.e. a metal sheet. In this case, the metal sheet welded to the metal terminal part is formed of a metal material having little or no electric potential difference compared to the C-clip, and prevents galvanic corrosion or fretting corrosion by using a metal having a high hardness. In addition, it can be easier and quicker to manufacture since a metal sheet is physically bonded to a metal terminal part due to friction heat generated by the vibration of the ultrasonic horn.

However, since the head of the ultrasonic horn is interfered with the injection-molded structure in the narrow part of the electronic device, it is difficult to enter the welding part, which makes welding work impossible.

SUMMARY

One technical task of the present disclosure is to provide an electronic device comprising a metal pad formed of a metal material having a conductivity and a corrosion resistance and a high hardness to be smoothly bonded to a metal terminal part regardless of the internal structure of a metal case.

Another technical task of the present disclosure is to provide an electronic device comprising a metal pad smoothly bonded to a metal terminal part regardless of the internal structure of a metal case.

According to an exemplary embodiment, there is provided an electronic device including a metal case having a metal terminal part formed therein, a metal pad bonded to the metal terminal part by laser welding, and a conductive first coating layer coated on one surface of the metal pad, wherein light reflectivity of the conductive first coating layer is lower than light reflectivity of the metal pad.

The first coating layer may be formed of a material having a corrosion resistance.

The metal pad may have a conductive second coating layer coated on the first coating layer.

The second coating layer may have a greater hardness than the first coating layer.

The second coating layer may be formed of a same material as a contact terminal electrically connected to the second coating layer.

The second coating layer and the contact terminal may be formed of one of gold, silver, platinum and nickel-palladium alloy.

The metal pad may be formed of one of copper, titanium, tin, phosphorus and zinc.

The metal pad may include copper and one of titanium, tin, phosphorus and zinc.

The first coating layer may include one of nickel and cobalt.

The second coating layer may be partly formed on a first coating layer.

The second coating layer may be formed of one of gold, silver, platinum, nickel-palladium and gold-cobalt alloy.

The electronic device may further include at least one melting part formed surrounding the metal pad by the laser welding.

The melting part may be formed of a reactant which is formed by melting a part of the metal pad, a part of the first coating layer, and a part of the metal terminal part.

The reactant may have a conductivity.

The electronic device may further include a double-sided tape for attaching the metal pad to the metal terminal part.

The double-sided tape may be attached only to a center portion of the metal pad.

The electronic device may further include a circuit board including the contact terminal, the circuit board being electrically connected to the metal case through the contact terminal.

The contact terminal may be formed in the form of one of a c-clip, a coil spring, and a pin.

The electronic device may further include an antenna or an electronic circuit formed in a metal case, and a molded material combined with an inside of the metal case to partly expose the metal terminal part.

DETAILED DESCRIPTION OF EXEMPLARY EMBODIMENTS

Hereinafter, embodiments of the present disclosure will be described in detail with reference to the drawings.

The present disclosure is not limited to an embodiment disclosed below and may be implemented in various forms and the scope of the present disclosure is not limited to the following embodiments. In addition, all changes or modifications derived from the meaning and scope of the claims and their equivalents should be construed as being included within the scope of the present disclosure. In the following description, the configuration which is publicly known but irrelevant to the gist of the present disclosure could be omitted. In addition, the attached drawings are not drawn to scale to facilitate understanding of the present disclosure, but the dimensions of some of the components may be exaggerated.

The structure of a metal pad and a welding of the metal pad to a metal terminal part, which is part of a metal case, will be applied to a small mobile electronic device, for example, a mobile phone. However, the present disclosure is not limited thereto, but applied to various electronic devices such as tablet computers, notebook computers, wearable devices, etc.

Figure 1:
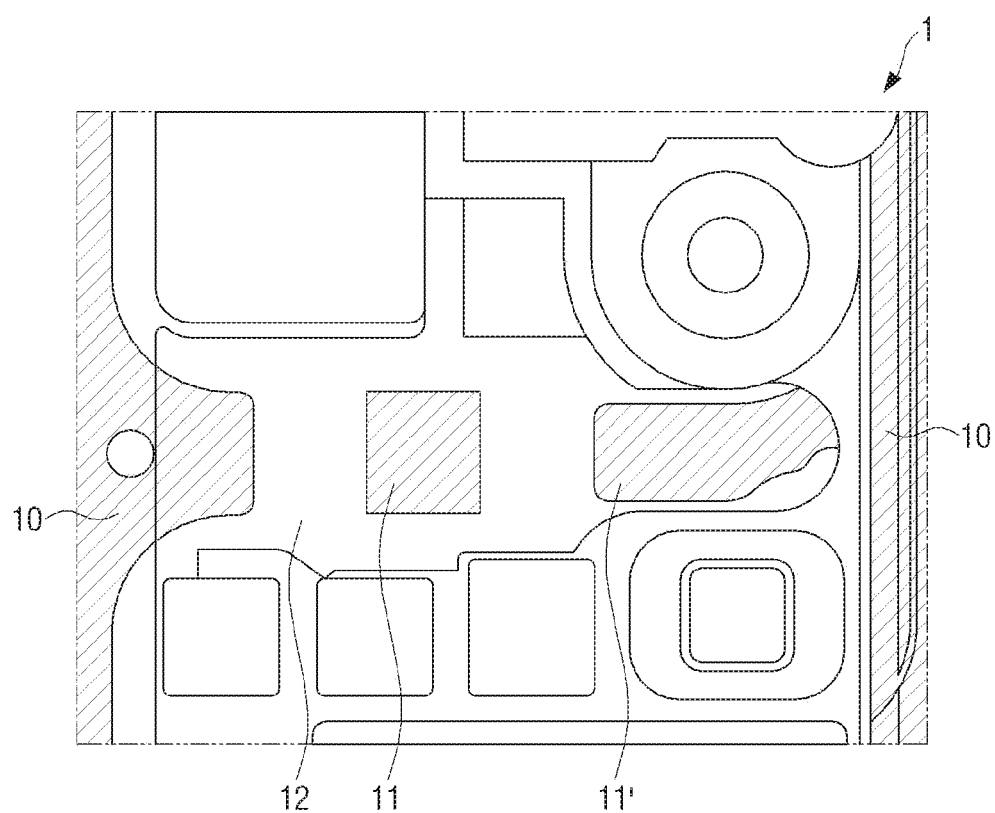
FIG. 1 is a plan view showing a metal terminal part and a metal case to which a metal pad is not bonded.

FIG. 1 is a plan view showing a metal terminal part and a metal case to which a metal pad is not bonded.

Referring to FIG. 1, an electronic device 1 may include a metal case 10 forming the outside of the electronic device. In this case, a molded material 12 in a predetermined shape may be bonded to the inside of the metal case 10.

The part of the inside side surface of the metal case 10 may be covered by the molded material 12 as shown in FIG. 1. In addition, metal terminal parts 11 and 11' forming the part of the inner side surface may be exposed through a hole provided in the molded material 12.

The metal case 1 may be electrically connected to an antenna or an electronic circuit through the metal terminal parts 11 and 11', and all or part of the metal case may be used as the antenna or the electronic circuit.

A metal case 10 may be generally made of a metal such as aluminum, magnesium, titanium, zinc, iron, and stainless steel, and the molded material 12 may be made of a synthetic resin such as a polymer.

Figure 4:
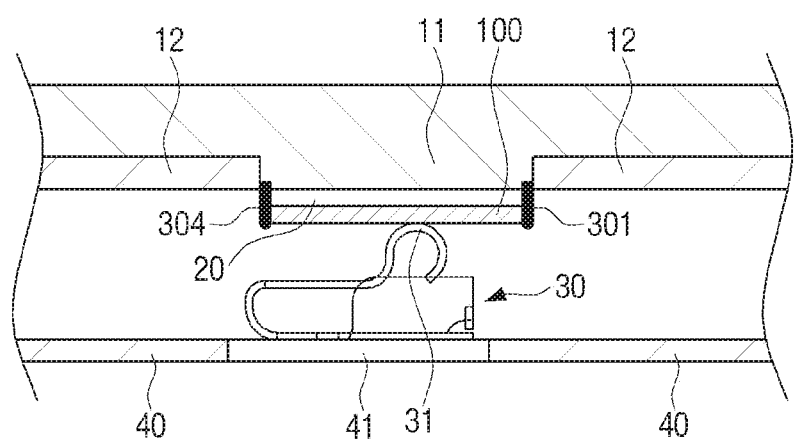
FIG. 4 is a cross-section view showing a metal pad on which a first coating layer is formed is in contact with a contact terminal of a circuit board according to an embodiment of the present disclosure.

The metal terminal part 11 and 11' may be electrically connected to a circuit board 40 through a contact terminal 30 of a circuit board 40 shown in FIG. 4. The number of metal terminal parts 11 and 11' may increases depending on the type and number of antennas or electronic circuits provided in the electronic device.

Referring to FIG. 1, the metal terminal parts 11 and 11' may be partly exposed by the molded material 12. Therefore, a plurality of metal terminal parts 11 and 11' may be insulated by the molded material 12 to prevent mutual interference of an antenna or an electronic circuit connected to each metal terminal part, and to ensure a normal operation of the antenna or the electronic circuit.

Hereinafter, referring to FIGS. 2 to 4, according to an embodiment of the present disclosure, the structure in which a metal pad 20 on which a first coating layer 100 is formed is bonded to a metal terminal part 11 will be described in detail.

Figure 2:
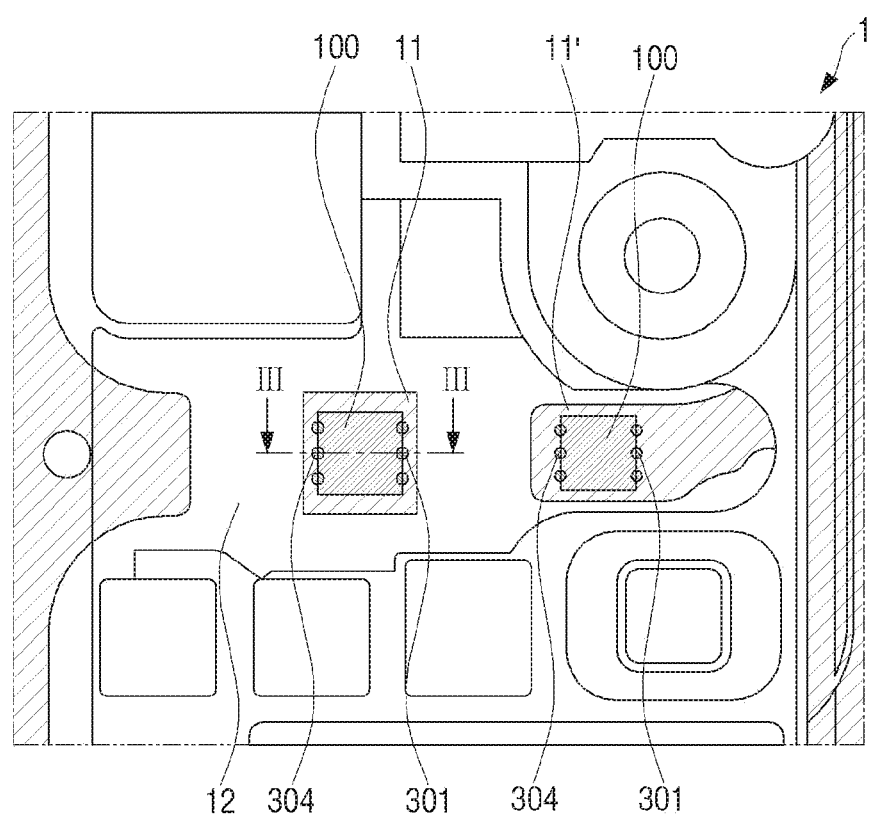
FIG. 2 is a plan view showing a metal pad on which a first coating layer is formed is bonded to a metal terminal part according to an embodiment of the present disclosure.
Figure 3:
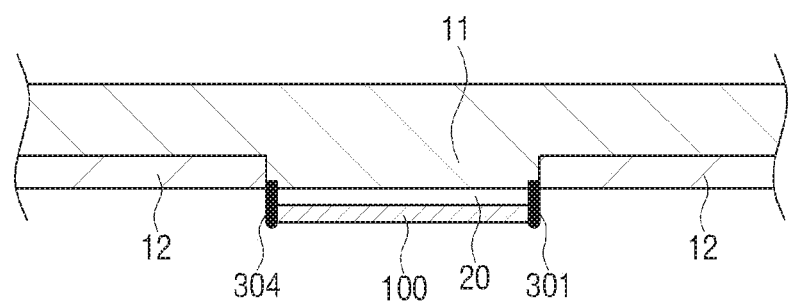
FIG. 3 is a cross-sectional view of a metal case taken along line III-III.

FIG. 2 is a plan view showing a metal pad 20 on which a first coating layer 100 is formed is bonded to a metal terminal part 11 according to an embodiment of the present disclosure, FIG. 3 is a cross-sectional view of a metal case 10 taken along line III-III, and FIG. 4 is a cross-section view showing a metal pad 20 on which a first coating layer 100 is formed is in contact with a contact terminal 30 of a circuit board 40 according to an embodiment of the present disclosure.

Referring to FIGS. 2 and 3, the metal pad 20 may be welded to the metal terminal part 11 to prevent the metal terminal part 11 from being worn or corroded.

Preferably, the metal pad 20 may be formed in the form of a foil, a film, and a plate to increase a contact area with the metal terminal part 11.

The metal pad 20 may be formed of a metal having a high conductivity to electrically connect the circuit terminal part 41 of the circuit board 40 to the metal terminal part 11. Accordingly, the metal pad 20 may be made of any one of copper, titanium, tin, phosphorus, and zinc. Further, the metal pad 20 may include copper, and may also be made of an alloy including at least one of titanium, tin, phosphorus, and zinc.

The metal pad 20 may be bonded to the metal terminal part 11 by laser welding. The metal pad 20 may be formed of a material having a relatively high light reflectivity, and when laser beam is directly irradiated on the metal pad 20 (particularly, infrared ray), optical reflection may occur, so that contact failure may likely occur. Considering this, the first coating layer 100 having a lower light reflectivity than the metal pad 20 may be formed on one surface of the metal pad 20.

The first coating layer 100 may be formed of a conductive material having a low light reflectivity than the metal pad 20. Therefore, the first coating layer 100 may directly contact the contact terminal 30 disposed at the circuit terminal part 41 of the circuit board 40 as shown in FIG. 4 and electrically connect the metal pad 20 and the metal terminal part 11 to the circuit terminal part 41 of the circuit board 40.

The first coating layer 100 may be made of a pure metal selected from the group consisting of nickel, cobalt, and palladium, or an alloy containing any one of nickel, cobalt, and palladium.

A process of bonding the metal pad 20 to the metal terminal part 11 through laser welding will be described in detail as below.

Referring to FIG. 3, after the metal pad 20 is disposed on one surface of the metal terminal part 11, the laser beam emitted from a laser emission device (not shown) may be irradiated on the first coating layer 100. Accordingly, the first coating layer 100 may absorb heat energy of laser beam, and the irradiated part may be melted by heat energy. The part of the melted first coating layer 100 may be at a high temperature. In addition, the parts of the metal pad 20 and the metal terminal part 11 corresponding to the part of the melted first coating layer 100 may receive heat from the first coating layer 100 to be melted. Accordingly, the metal pad 20 may be bonded to the metal terminal part 11.

As described above, the first coating layer 100, the metal pad 20 and the metal terminal part 11 may be partly melted at the high temperature and form the melting parts 301 and 304.

In addition, the melting parts 301 and 304 may become hardened at a room temperature while being lowered in a temperature by air thereby to solidify bonding between the metal pad 20 and the metal terminal part 11.

Referring to FIG. 4, the contact terminal 30 may be provided on the circuit terminal part 41 of the circuit board 40, and electrically connected to the circuit terminal part 41. The contact terminal 30 may have a conductivity to electrically connect the circuit terminal part 41 to the metal terminal part 11, and contact the metal pad 20 or the first coating layer 100.

Therefore, the circuit terminal part 41 may be electrically connected to the metal pad 20 and the metal terminal part 11 through the contact terminal 30 to be electrically connected to the metal case 10.

In addition, the contact terminal 30 may be formed in any one of a c-clip, a spring shape, and a pin shape. Typically, a coil spring may be used as a spring, but another type of conductive spring may also be used.

Referring to FIG. 4, for ease of explanation, c-clip is exemplified as the contact terminal 30. However, the present disclosure is not limited thereto, but could be applied to various types of contact terminals.

The contact terminal 30 may have elasticity, and be elastically connected to the metal pad 20 or the first coating layer 100.

The contact terminal 30 may vibrate by an external impact, and shrink or expand in accordance with a temperature change. When the contact terminal 30 moves, wear may occur due to friction with another metal. Therefore, the contact terminal 30 may be generally formed of a metal having a high corrosion resistance and hardness to prevent damage caused by wear and corrosion.

The contact terminal 30 may be formed any one of gold, silver, platinum, palladium, nickel-palladium, and gold-cobalt.

In order to reduce the manufacturing cost of the contact terminal 30, only a contact surface 31 where the contact terminal 30 is in contact with the metal pad 20, may be coated by one of gold, silver, platinum, palladium, nickel-palladium and gold-cobalt.

However, the metal pad 20 to which the contact terminal 30 is contacted may be made of copper, titanium, tin, phosphorus and zinc, which are more conductive than gold, silver, platinum, palladium, nickel-palladium and gold-cobalt, but are low in electric potential difference and hardness, and thus, it is vulnerable to corrosion and wear.

Therefore, when the metal pad 20 is in direct contact with the contact terminal 30, corrosion caused by electric potential difference may occur. In addition, the metal pad 20 may be worn by fine vibration of the contact terminal 30 having elasticity, and thus corrosion may occur.

Therefore, the first coating layer 100 may be formed of a metal having a corrosion resistance to prevent that the metal pad 20 from being worn or the worn part from being corroded while being in direct contact with the contact terminal 30 shown in FIG. 4.

Nickel, cobalt, and palladium that form the first coating layer 100 may be more resistant to corrosion than copper, titanium, tin, phosphorus, and zinc, which form the metal pad 20.

The first coating layer 100 may be formed on one surface of the metal pad 20. The first coating layer 100 may be formed on all surfaces on which the metal pad 20 is exposed, but the metal pad 20 may have a very narrow size of about 1 mm$^2$ to 50 mm$^2$. Therefore, it is not advantageous to coat all the exposed surfaces of the metal pad 20, which results in a significant rise in manufacturing costs.

The first coating layer 100 may be formed of a less conductive metal than the metal pad 20. Therefore, when the metal pad 20 coats all the exposed surfaces, the conductivity of the metal pad 20 may be affected. Therefore, it is preferable that the first coating layer 100 is formed only on the surface where the metal pad 20 is in direct contact with the contact surface 31 of the contact terminal 30.

Referring to FIGS. 5 to 10, according to another embodiment of the present disclosure, the structure in which the metal pad 20 on which the second coating layer 200 is formed is bonded to the metal terminal part 11 will be described in detail below.

However, in comparison with an embodiment of the present disclosure, the configuration having a difference in another embodiment of the present disclosure is the second coating layer, and therefore only the description thereof will be made. Since the other configurations in another embodiment of the present disclosure are the same as those in an embodiment of the present disclosure. Therefore, the description of the same configuration will be omitted to avoid repetition.

Figure 5:
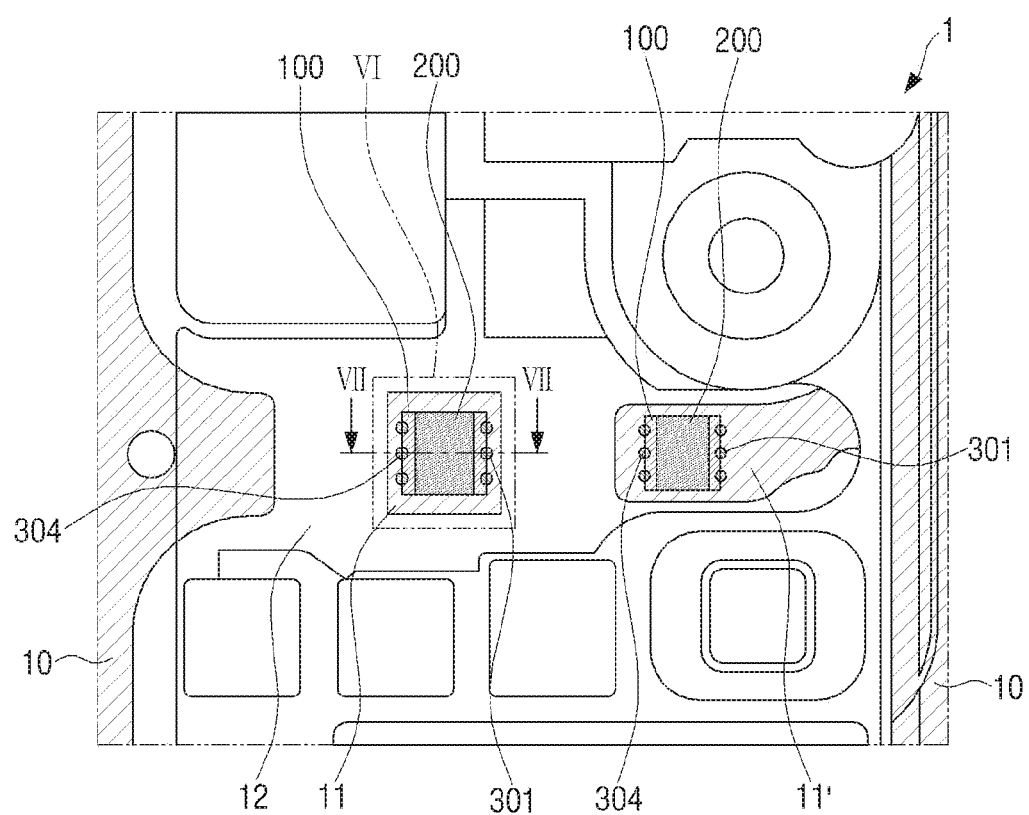
FIG. 5 is a plan view showing a metal pad on which a second coating layer is formed is bonded to a metal terminal part according to another embodiment of the present disclosure.
Figure 6:
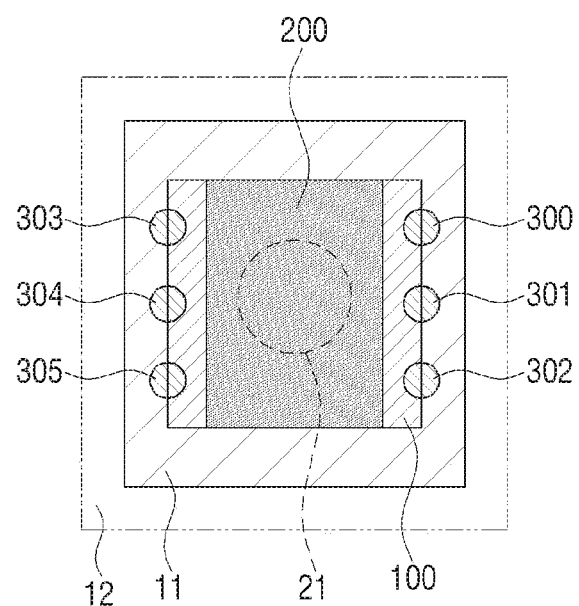
FIG. 6 is an enlarged plan view illustrating part VI shown in FIG. 5.

FIG. 5 is a plan view showing a metal pad 20 on which a second coating layer 200 is formed is bonded to a metal terminal part 11 according to another embodiment of the present disclosure, and FIG. 6 is an enlarged plan view illustrating part VI shown in FIG. 5.

Figure 7:
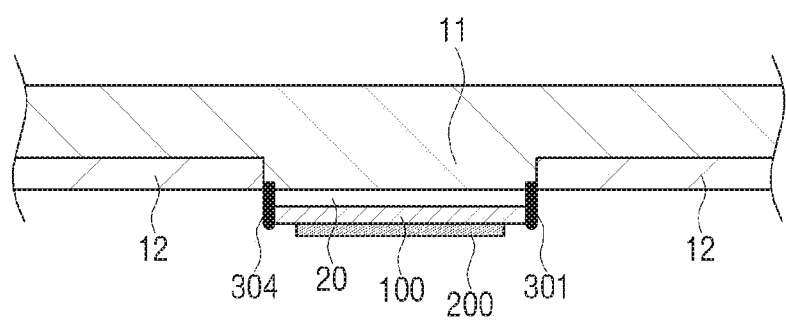
FIG. 7 is a cross-sectional view illustrating a metal case taken along line VII-VII of FIG. 5.
Figure 8:
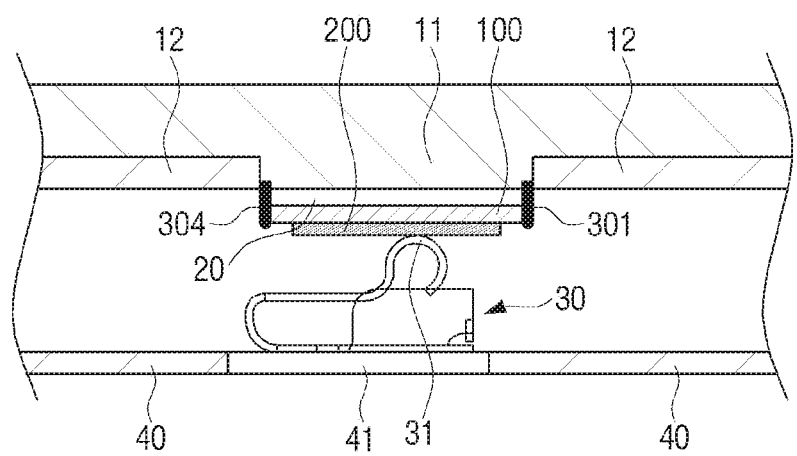
FIG. 8 is a cross-sectional view showing a metal pad on which a second coating layer is formed is in contact with a contact terminal of a circuit board according to another embodiment of the present disclosure.

FIG. 7 is a cross-sectional view illustrating a metal case 10 taken along line VII-VII of FIG. 5. FIG. 8 is a cross-sectional view illustrating that a metal pad 20 on which a second coating layer 200 is formed is in contact with a contact terminal 30 of a circuit board 40 according to another embodiment of the present disclosure.

Referring to FIGS. 5 to 8, the second coating layer 200 may be formed on the first coating layer 100.

The first coating layer 100 may be formed of a more resistant metal than the metal pad 20, but less hard than a metal forming the contact terminal 30 shown in FIG. 8. Therefore, when the first coating layer 100 is in direct contact with the contact surface 31 of the contact terminal 30, the first coating layer 100 may be worn by the vibration of the contact terminal 30 having elasticity. Such wear may cause corrosion, and damage the metal pad 20.

Therefore, the second coating layer 200 may have a conductivity, and be formed of a metal having a greater hardness than the first coating layer 100. In addition, the second coating layer 200 may be formed on the first coating layer 100 so that the second coating layer 200 is in direct contact with the contact surface 31 of the contact terminal 30. Accordingly, the first coating layer 100 may be prevented from being worn and corroded.

The second coating layer 200 may be formed of a metal having a hardness greater than or the same as that of a metal forming the contact terminal 30 of the circuit board 40 or a metal coated on the contact surface 31.

The second coating layer 200 may be made of any one of gold, silver, platinum, nickel-palladium alloy and gold-cobalt alloy.

The second coating layer 200 may be formed of a material having a relatively high light reflectivity. Therefore, laser beam directly irradiated on the second coating layer (particularly, infrared ray) may cause optical reflection, which results in the high possibility of contact failure. Considering this aspect, it is preferable that the second coating layer 200 is partly formed on the first coating layer 100.

Referring to FIG. 6, it is preferable that the second coating layer 200 is formed at a center portion 21 of the metal pad 20 or near the center portion. In this case, the second coating layer 200 may not be provided in a position where a plurality of melting parts 300, 301, 302, 303, 304 and 305 are formed or near the position for laser welding using the first coating layer 100.

The center portion 21 of the metal 20 may mainly contact the contact surface 31 of the contact terminal 30 provided on the circuit board 40. Therefore, it is preferable that the second coating layer 200 is centrally formed in the center portion 21 of the metal pad 20.

Referring to FIG. 6, the plurality of melting parts 300, 301, 302, 303, 304 and 305 may surround the metal pad 20. Since the contact surface 31 of the contact terminal 30 provided on the circuit board 40 contacts the center portion 21 of the metal pad, the melting part 300 may not be formed.

To enable the metal pad 20 to be stably bonded to the metal terminal part 11, the melting part 300 may have two or more of melting parts, and the melting parts 301 and 304 may be formed on both surfaces of the metal pad 20. However, the present disclosure is not limited thereto.

The melting part 300 may further include a reactant (not shown) formed by melting the metal pad 20 formed of different metals, the first coating layer 100 and the metal terminal part 11 in part.

The reactant may have a conductivity by melting materials of the first coating layer 100, the metal pad 20, and the metal terminal part 11. Therefore, the metal pad 20 may be electrically connected to the metal terminal part 11 through the reactant.

Figure 9:
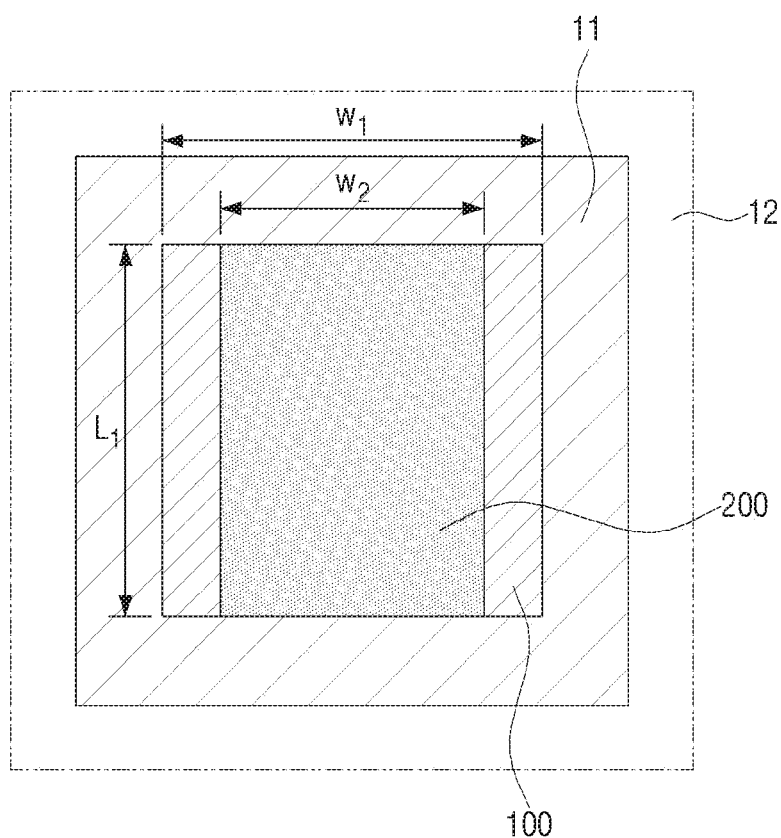
FIGS. 9 and 10 are views illustrating a metal pad on which a second coating layer is formed, and the sizes of the first and second coating layers according to another embodiment of the present disclosure.

FIG. 9 is a schematic plan view illustrating that a metal pad 20 on which a second coating layer 200 is formed is bonded to a metal terminal part 11 according to another embodiment of the present disclosure.

Referring to FIG. 9, the illustrating of the plurality of melting parts 300, 301, 302, 303, 304 and 305 will be omitted to clearly show the sizes of the metal pad 20, the first coating layer 100 and the second coating 200 according to an embodiment and another embodiment of the present disclosure.

Referring to FIG. 9, the size of the metal pad 20 on which the second coating layer is formed will be defined according to another embodiment of the present disclosure.

The first coating layer 100 may have a width of W1 and a height of L1. In addition, the second coating layer 200

As described above, the metal pad 20 may be laser welded by the first coating layer 100, it is preferable that the size of the metal pad 20 is the same as that of the first coating layer 100. Therefore, the metal pad 20 may have the width of W1, and the height of L1.

The sizes of the metal pad 20 and the first coating layer 100 may be preferably 1 mm$^2$ or more to 50 mm$^2$ or less when calculated by W1×L1.

It is preferable that the second coating layer 200 has a size smaller than that of the first coating layer 100 when calculated by W2×L1 such that the second coating layer is not formed in the portion where the melting part 300 is formed.

Figure 10:
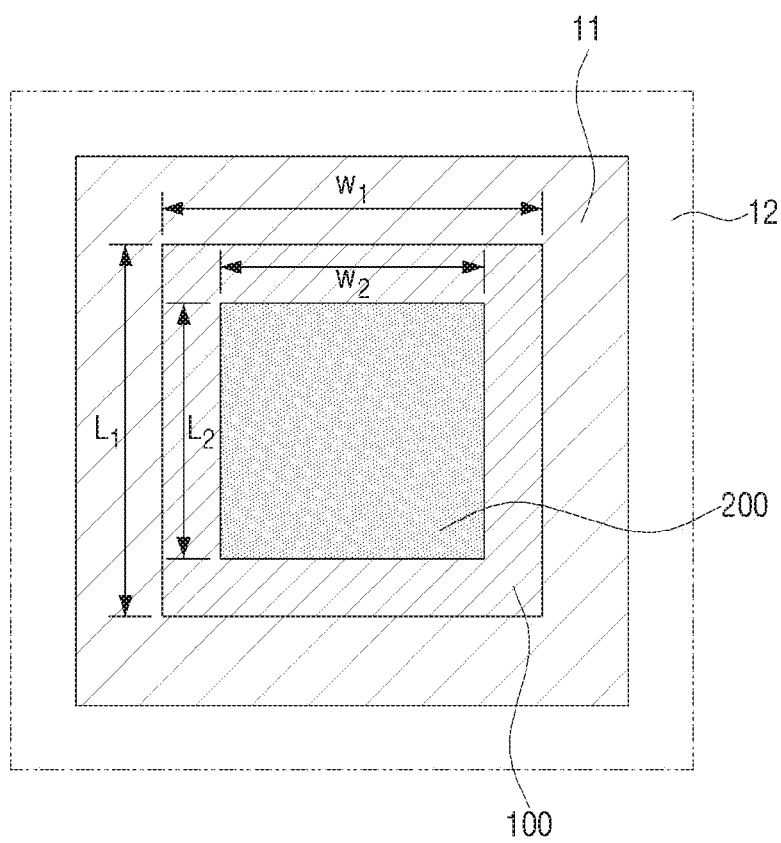

FIG. 10 is a schematic plan view illustrating a metal pad 20 on which a second coating layer 200 is formed is bonded to a metal terminal part 11 according to another embodiment of the present disclosure.

Referring to FIG. 10, the illustrations of the plurality of melting parts 300, 301, 302, 303, 304 and 305 will be omitted in order to specify the size of the second coating layer 200 according to another embodiment of the present disclosure.

Referring to FIG. 10, the size of the second coating layer 200 will be defined as below.

The second coating layer 200 may have a width of W2 and a height of L2. The width of W2 and the height of L2 of the second coating layer 200 may be smaller than the width of W1 and the height of L1 of the first coating layer 100.

When the size of the second coating layer 20 is calculated by W2×L2, the melting part 300 may be formed surrounding the metal pad 20. Therefore, the metal pad 20 may be firmly bonded to the metal terminal part 11.

Figure 11:
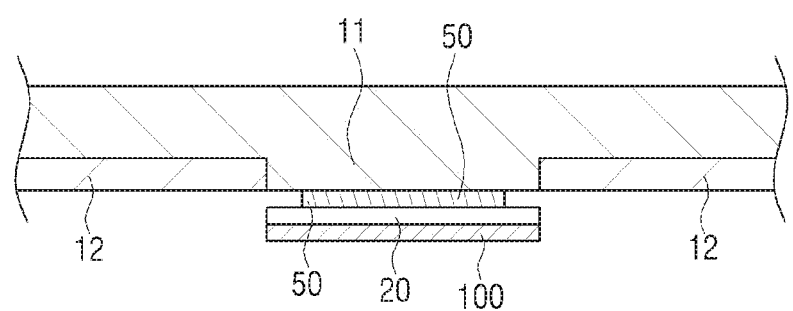
FIGS. 11A and 11B are cross-sectional views showing a metal pad on which a first coating layer is formed is attached to a metal terminal part by a double-sided tape according to another embodiment of the present disclosure.
Figure 11:
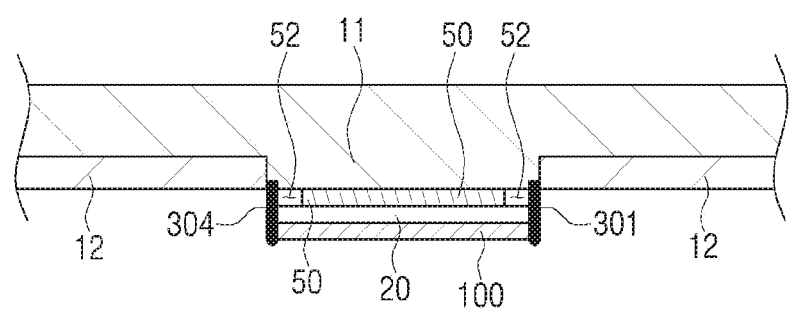
Figure 12:
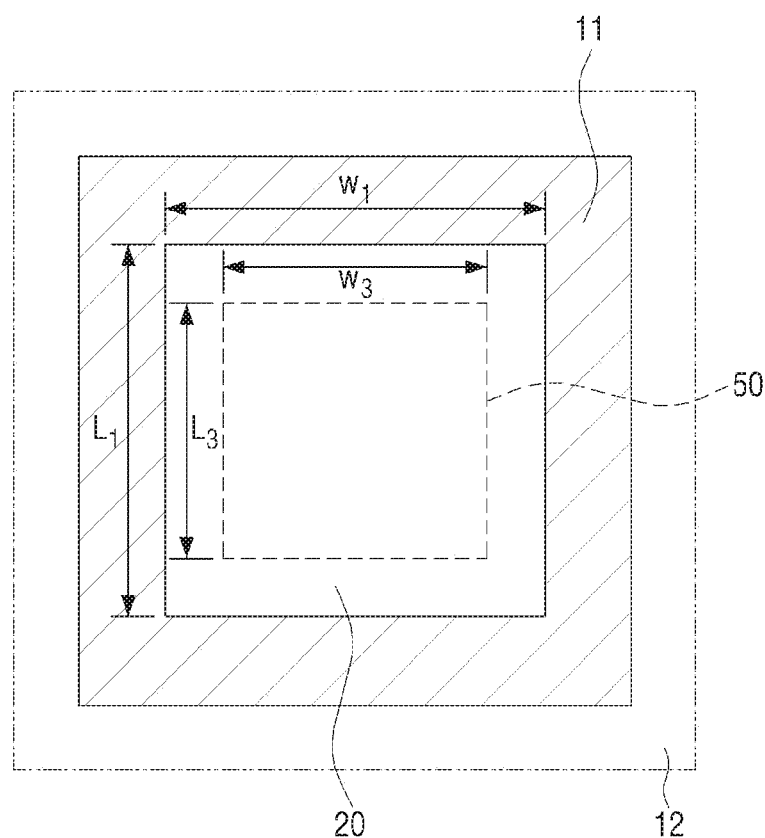
FIG. 12 is a plan view showing the size of the double-sided tape according to another embodiment of the present disclosure.

Referring to FIGS. 11A, 11B, and 12, the configuration in which the metal pad on which the first coating layer 200 is formed is attached to the metal terminal part 11 by using the double-sided tape 50 and bonded thereto through laser welding will be described in detail.

However, in comparison with an embodiment of the present disclosure, the configuration having a difference in another embodiment of the present disclosure is the double-sided tape 50, and therefore only the description thereof will be made. Since the other configurations in another embodiment of the present disclosure are the same as those in an embodiment of the present disclosure. Therefore, the description of the same configuration will be omitted to avoid repetition.

FIGS. 11A and 11B are cross-sectional views sequentially showing a state in which the metal pad 20 is attached to the metal terminal part 11 by using the double-sided tape 50 before laser welding and the metal pad 20 is temporarily fixed, and a state in which the metal pad 20 is bonded to the metal terminal part 11 through laser welding.

Referring to FIG. 11A, the metal pad 20 may be attached to the metal terminal part 11 by using the double-sided tape

50 before laser welding. Therefore, the double-sided tape 50 may be disposed between the metal pad 20 and the metal terminal part 11.

The double-sided tape 50 may be made of a synthetic resin material such as acrylic or epoxy which is not electrically conductive. However, the present invention is not limited thereto, and a double-sided tape (not shown) having a conductivity may be used. The conductive double-sided tape may be formed of a conductive adhesive and a film coated with one of gold, silver, platinum and nickel.

When the metal pad 20 is attached to the metal terminal part 11 by using the double-sided tape 50 without conductivity, the metal terminal part 11 may be electrically connected to the metal pad 20 through the melting parts 301 and 304. The center portion 21 of the metal pad 20 may be insulated by the double-sided tape 50.

In this case, the double-sided tape 50 may be attached only to the center portion 21 of the metal pad 20 or its periphery. Since the center portion 21 of the metal pad 20 is insulated by the double-sided tape 30 without conductivity such that it cannot be conductive, and the metal pad 20 is electrically connected to the metal terminal part 11 through the melting parts 301 and 304, by making the size of the double-sided tape 50 to be the same as that of the metal pad 20, and melting the double-sided tape 50 with the melting parts 301 and 304 during laser welding, the melting parts 301 and 304 may be degraded or lost in conductivity, or malfunction may be caused.

Therefore, the size of the double-sided tape 50 may need to be limited not to be melted with the melting parts 301 and 304.

FIG. 12 is a plan view showing the size of the double-sided tape according to another embodiment of the present disclosure. The illustration of the first or second coating layer will be omitted to specify the size of the double-sided tape 50.

Referring to FIG. 12, the width of the double-sided tape 50 may be defined as W3 and the height thereof may be defined as L3.

The width W3 or and the height of L3 of the double-sided tape 50 may be formed to be smaller than the width W1 and the height L1 of the metal pad 20 and the first coating layer 100. The width W3 and the height L3 of the double-sided tape 50 may be the same or smaller than the width W2 and the height L2 of the second coating layer 200 shown in FIG. 10.

It is preferable that the value obtained by calculating the width W3×L3, which is the size of the double-sided tape 50, may be ⅔ or less of the value of W1×L1, which is the size of the metal pad 20. When the W3×L3 value is equal to or less than ⅔ of the W1×L1 value, the double-sided tape 50 may not be melted at the time of laser welding even when the double-sided tape 50 is bonded to the center portion 21 as a reference.

FIG. 11B is a cross-sectional view illustrating that the metal pad 20 is attached to the metal terminal part 11 by using the double-sided tape 50, which is ⅔ of the metal pad 20, and is bonded to the metal terminal part 11 through laser welding.

Referring to FIG. 11B, since the double-sided tape 50 is equal to or less than ⅔ of the size of the metal pad 20, it is not melted in the melting parts 301 and 304. In addition, after laser welding, a fine hole 52 may be formed between the metal pad 20, the metal terminal part 11, the melting parts 301 and 304 and the double-sided tape 50.

When the metal pad 20 is attached to the metal terminal part 11 by using a conductive double-sided tape (not shown), it is preferable that the conductive double-sided tape may be formed in the center portion 21 of the metal pad 20 to prevent a non-metal material from being merged. In this case, the fine hole 52 may also be generated after laser welding.

According to another embodiment of the present disclosure, in a process of bonding the metal pad 20 to the metal terminal part 11, when the double-sided tape 50 is used, the metal pad 20 may be fixed to a position to be bonded in advance. Therefore, since the operator does not need to fix the metal pad 20 when performing laser welding, the accuracy of the laser welding may be increased and the working efficiency may be improved by simplifying the manufacturing process and shortening the manufacturing time.

Figure 13A:
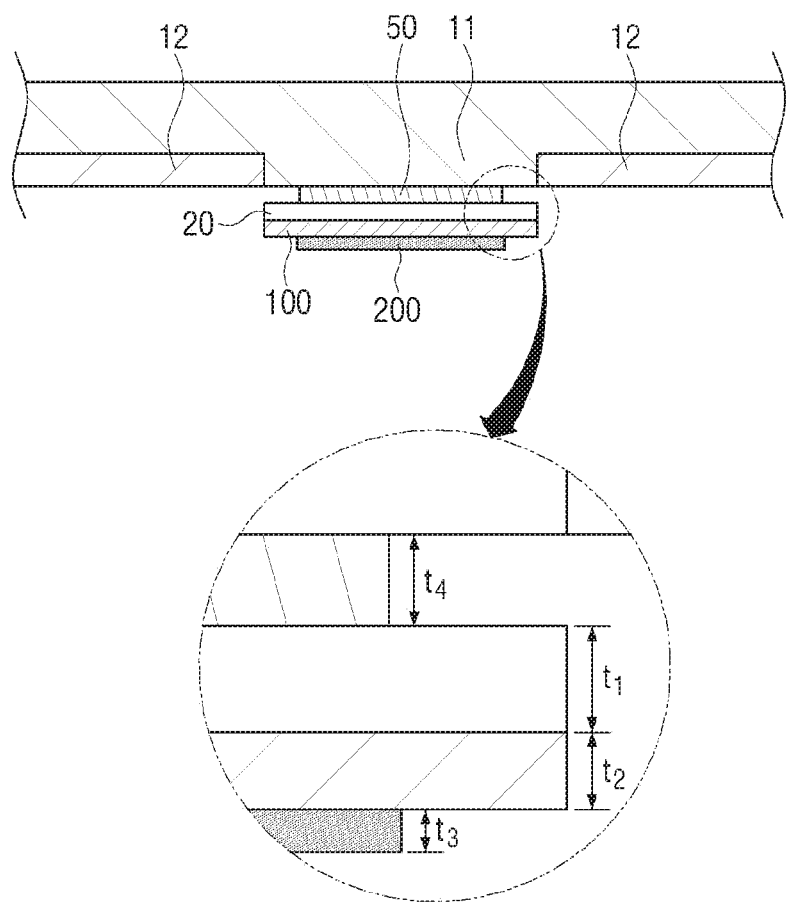
FIGS. 13A and 13B are views showing thicknesses of a metal pad, first and second coating layers, and a double-sided tape.
Figure 13B:
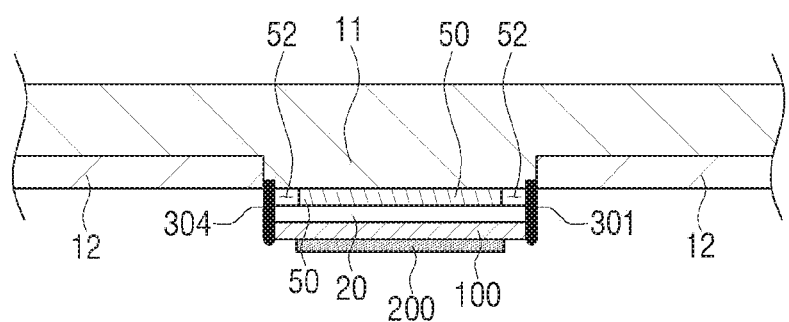
Figure 14:
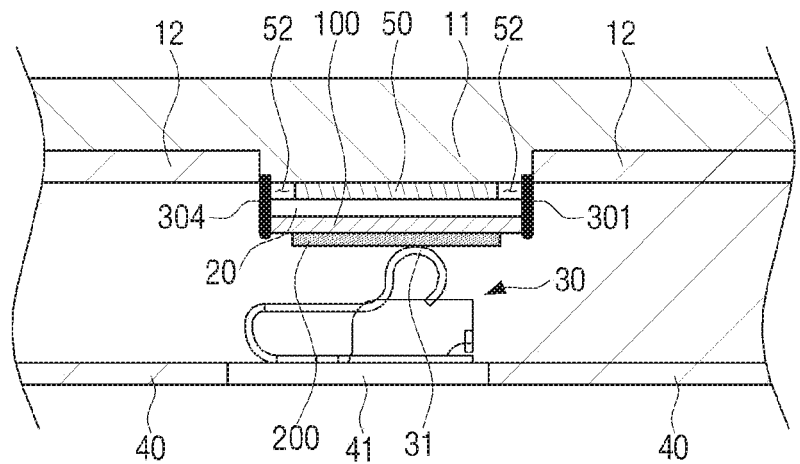
FIG. 14 is a cross-sectional view showing a metal pad on which a second coating layer is formed is in contact with a contact terminal of a circuit board according to another embodiment of the present disclosure.

Referring to FIGS. 13A, 13B and 14, the configuration in which a metal pad 20 on which a second coating layer 200 is formed is attached to a metal terminal part 11 by using a double-sided tape 50 and bonded thereto through laser welding according to another embodiment of the present disclosure will be described in detail.

However, in comparison with an embodiment of the present disclosure, the configuration having a difference in another embodiment of the present disclosure is the double-sided tape 50, and therefore only the description thereof will be made. Since the other configurations in another embodiment of the present disclosure are the same as those in an embodiment of the present disclosure. Therefore, the description of the same configuration will be omitted to avoid repetition.

For ease of explanation for another embodiment of the present disclosure, FIGS. 13A and 13B exaggerate the thicknesses of the metal pad 20, the first coating layer 100, the second coating layer 200, and the double-sided tape 50. However, there is not much difference to the extent that is it impossible to distinguish each thickness with the naked eye.

FIG. 13A illustrates that the metal pad 20 on which the first and second coating layers 100 and 200 are formed are attached to the metal terminal part 11 by the double-sided tape 50 before laser welding.

Referring to FIG. 13A, the thickness of the metal pad 20 may be defined as t1, the thickness of the first coating layer 100 may be defined as t2, the thickness of the second coating layer 200 may be defined as t3, and the thickness of the double-sided tape 50 will be defined as t4.

The thickness t1 of the metal pad 20 may be preferably between 0.02 mm and 0.5 mm and the thickest in comparison with those of other constituent elements.

The thickness t2 of the first coating layer 100 may be preferably between 0.003 mm and 0.015 mm. The thickness less than 0.003 mm may make it difficult to function as a first coating layer, and the thickness greater than 0.015 mm may increase the manufacturing costs.

The thickness t2 of the second coating layer 200 may be preferably between 0.00003 mm and 0.001 mm. The thickness less than 0.00003 mm may make it difficult to function as a second coating layer, and the thickness greater than 0.001 mm may increase the manufacturing costs.

When the thickness of the double-sided tape 50 is too great, the electronic device may become thicker overall, and thus the thickness t4 of the double-sided tape 50 may be preferably not more than ⅓ of the thickness of the metal pad 20.

FIG. 13B illustrates that the metal pad 20 attached to the metal terminal part 11 by the double-sided tape 50 is bonded to the metal terminal part 11 by laser welding.

Referring to FIG. 13B, since the double-sided tape 50 is formed to be no more than ⅔ of the metal pad 20, the double-sided tape 50 may not be melted in the melting parts 301 and 304. In addition, since the double-sided tape 50 is attached to the center portion 21 of the metal pad, the fine hole 52 may be formed between the metal pad 20, the metal terminal part 11, the melting parts 301 and 304, and the double-sided tape 50.

FIG. 14 is a cross-sectional view showing a metal pad 20 on which a second coating layer 200 is formed is in contact with a contact terminal 30 of a circuit board according to another embodiment of the present disclosure.

Referring to FIG. 14, the double-sided tape 50 without conductivity may be attached so that the center portion 21 of the metal pad 20 may be insulated. In this case, the metal pad 20 and the metal terminal part 11 may be electrically connected to each other through the melting parts 301 and 304.

In comparison with another embodiment of the present disclosure, the the electronic device 1 may become thicker overall due to the thickness of the double-sided tape 50. However, it becomes easy to bond the metal pad 20 to the metal terminal part 11 by the double-sided tape 50, thereby reducing the manufacturing cost and time.

Figure 15:
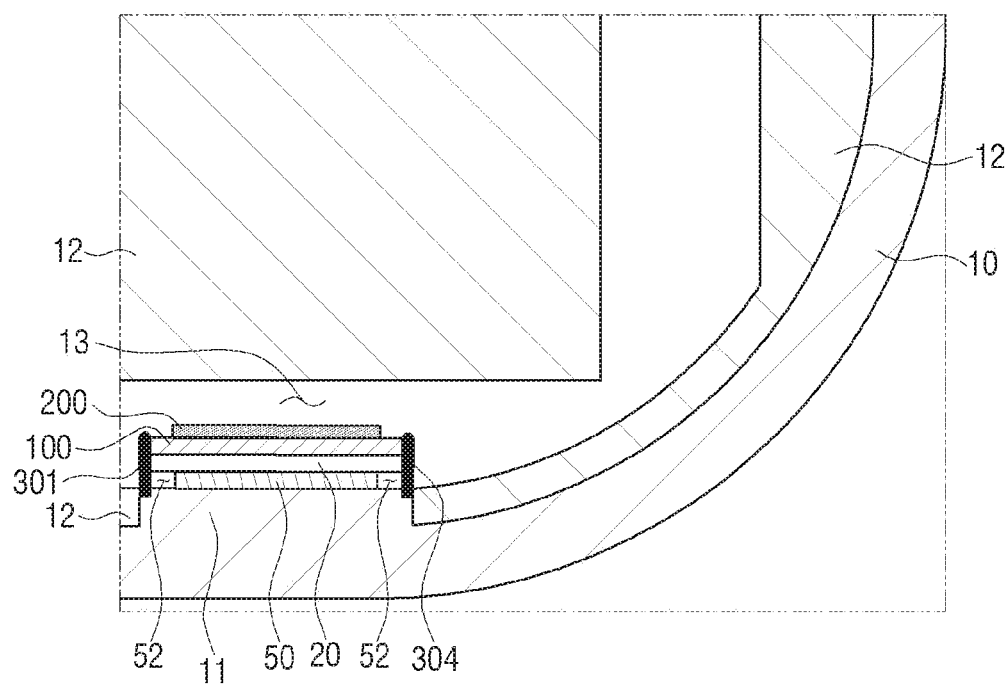
FIG. 15 is a cross-sectional view showing a metal pad on which a second coating layer is formed is bonded to an edge in an electronic device according to another embodiment of the present disclosure.

FIG. 15 illustrates that a metal pad 20 is bonded to a narrow portion 13 of an electronic device 1 according to another embodiment of the present disclosure.

However, the configuration of the double-sided tape 50 to bond the metal pad 20, the first and second coating layers 100 and 200 formed on the metal pad 20 and the double-sided tape 50 to the metal terminal part 11 are the same as those in the above-described example embodiments of the present disclosure. Therefore, the detailed description will be omitted. Hereinafter, a process of bonding the metal pad to the narrow portion 13 by using laser will be described.

FIG. 15 illustrates that the metal pad 20 on which the second coating layer 200 is formed is bonded to the narrow part 13 in the electronic device 1 according to another embodiment of the present disclosure.

Referring to FIG. 15, it is difficult to apply the metal pad 20 to the metal terminal part 11 in the narrow part 13 inside the electronic device 1 by using an ultrasonic horn.

An ultrasonic horn used for ultrasonic welding may have a head (not shown) in a predetermined shape. However, the head having the predetermined shape may be inserted into the narrow part 13 in the electronic device 1 due to the molded material 12 formed near the narrow part 13 inside the electronic device 1 and the structure thereof.

However, according to another embodiment of the present disclosure, when the metal pad 20 is welded using laser, laser may be irradiated at different angles, and the metal pad 20 may be bonded to the metal terminal part 11 disposed in the narrow part 13. Therefore, when the metal pad 20 is bonded to the metal terminal part 11 disposed in the narrow part 13 through laser welding, bonding may be easily performed regardless of the molded material 12 nearby and the structure thereof.

In addition, various antennas or electronic circuits may be provided in the narrow part 13, thereby improving the overall function of the electronic device.

Figure 16:
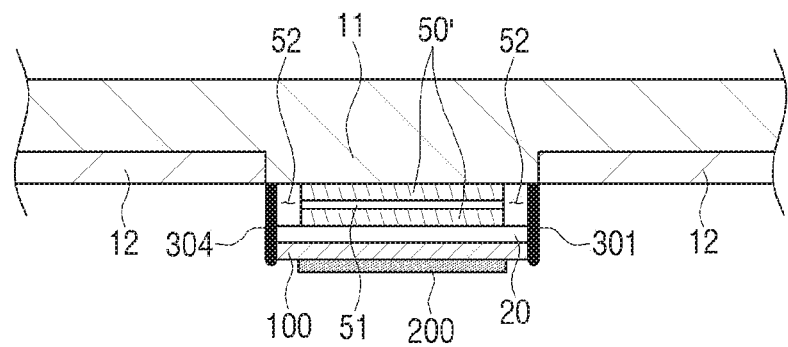
FIG. 16 is a cross-sectional view showing a PET layer is inserted into a double-sided tape according to another embodiment of the present disclosure.

FIG. 16 illustrates the configuration in which the metal pad 20 is bonded to the metal terminal part 11 by using the double-sided tape 50' including an insulation layer according to another embodiment of the present disclosure.

However, in comparison with an embodiment of the present disclosure, the configuration having a difference in another embodiment of the present disclosure is the double-sided tape 50', and therefore only the description thereof will be made. Since the other configurations in another embodiment of the present disclosure are the same as those in an embodiment of the present disclosure. Therefore, the description of the same configuration will be omitted to avoid repetition.

Referring to FIG. 16, the double-sided tape 50' may further include a layer 51 formed of PolyEthylene Terephthalate (PET).

The PET may be used as an electrical insulating material, and have excellent heat insulation, and the PET layer 51 may be formed in the double-sided tape 50'.

Therefore, when the metal pad 20 is attached to the metal terminal part 11 by using the double-sided tape 50' further including the PET layer 51, the center portion 21 of the metal pad 20 may be insulated.

When the metal pad 20 is attached to the metal terminal part 11 by using the double-sided tape 50' including the PET layer 51, the metal pad 20 and the metal terminal part 11 may be electrically connected to each other only through the melting parts 301 and 304.

Figure 17:
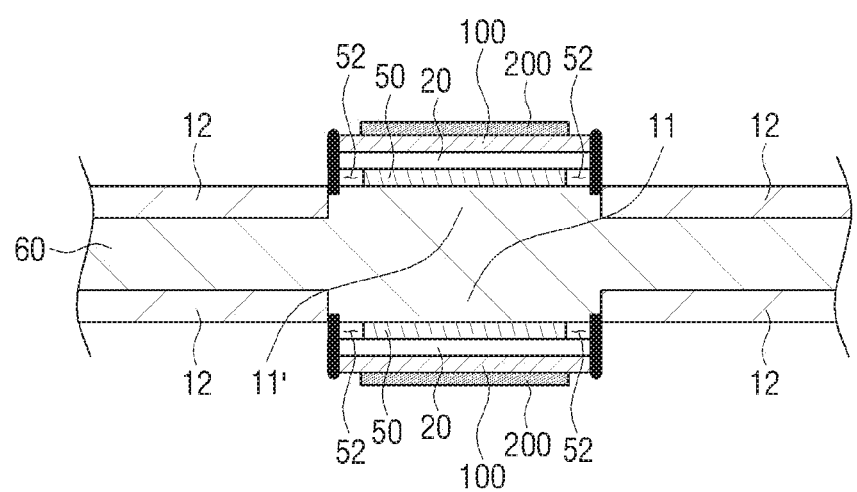
FIG. 17 is a cross-sectional view showing a plurality of metal pads on which a second coating layer is formed are bonded to a metal terminal part according to another embodiment of the present disclosure.

FIG. 17 illustrates that the metal pad 20 is bonded to the metal case 60 having the plurality of metal terminal parts 11 and 11' according to another embodiment of the present disclosure.

However, in comparison with an embodiment of the present disclosure, the configuration having a difference in another embodiment of the present disclosure is the metal case 60, and therefore only the description thereof will be made. Since the other configurations in another embodiment of the present disclosure are the same as those in an embodiment of the present disclosure. Therefore, the description of the same configuration will be omitted to avoid repetition.

Referring to FIG. 17, the metal case 60 may include the plurality of metal terminal parts 11 and 11'. Such the plurality of metal terminal parts 11 and 11' may be formed on the same plane, but the metal terminal part 11 may be formed on one surface of the metal case 60, and the other metal terminal part 11' may be formed on the other surface of the metal case 60.

In this case, the plurality of metal terminal parts 11 and 11' may be formed on both surfaces of the metal case 60, and the metal pad 20 may be bonded to each metal terminal part. Since the plurality of metal terminal parts 11 and 11' are formed on both surfaces of the metal case 60, space efficiency in the electronic device 1 may increase, and the number of antennas or electronic circuits may increase, thereby improving the function of the electronic device.

Although exemplary embodiments have been shown and described, it will be appreciated by those skilled in the art that changes may be made to these exemplary embodiments without departing from the principles and spirit of the present disclosure. Accordingly, the scope of the present disclosure is not construed as being limited to the described exemplary embodiments, but is defined by the appended claims as well as equivalents thereto.

What is claimed is:

1. An electronic device, comprising:
   a metal case having a metal terminal part formed therein;
   a metal pad bonded to the metal terminal part by laser welding;
   a conductive first coating layer coated on one surface of the metal pad; and
   a melting part formed as the conductive first coating layer, the metal pad and the metal terminal part are partly melted by the laser welding, wherein light reflectivity of the conductive first coating layer is lower than light reflectivity of the metal pad, and wherein the melting part is formed surrounding the metal pad by the laser welding.

2. The electronic device as claimed in claim 1, wherein the first coating layer is formed of a material having a corrosion resistance.

3. The electronic device as claimed in claim 1, wherein the metal pad has a conductive second coating layer coated on the first coating layer.

4. The electronic device as claimed in claim 3, wherein the second coating layer has a greater hardness than the first coating layer.

5. The electronic device as claimed in claim 4, wherein the second coating layer is formed of one of gold, silver, platinum, nickel-palladium and gold-cobalt alloy.

6. The electronic device as claimed in claim 3, wherein the second coating layer is formed of a same material as a contact terminal electrically connected to the second coating layer.

7. The electronic device as claimed in claim 6, wherein the second coating layer and the contact terminal are formed of one of gold, silver, platinum and nickel-palladium alloy.

8. The electronic device as claimed in claim 6, further comprising:

a circuit board including the contact terminal, the circuit board being electrically connected to the metal case through the contact terminal.

9. The electronic device as claimed in claim 3, wherein the second coating layer is partly formed on a first coating layer.

10. The electronic device as claimed in claim 1, wherein the metal pad is formed of one of copper, titanium, tin, phosphorus and zinc.

11. The electronic device as claimed in claim 1, wherein the first coating layer includes one of nickel and cobalt.

12. The electronic device as claimed in claim 1, wherein the melting part is formed of a reactant which is formed by melting a part of the metal pad, a part of the first coating layer, and a part of the metal terminal part.

13. The electronic device as claimed in claim 1, further comprising:

a double-sided tape for attaching the metal pad to the metal terminal part.

14. The electronic device as claimed in claim 1, further comprising:

an antenna or an electronic circuit formed in a metal case; and a molded material combined with an inside of the metal case to partly expose the metal terminal part.

* * * * *